US010069291B2

(12) United States Patent
Kitagawa et al.

(10) Patent No.: US 10,069,291 B2
(45) Date of Patent: Sep. 4, 2018

(54) TERMINAL FITTING FIXING STRUCTURE AND WIRE HARNESS

(71) Applicant: Yazaki Corporation, Tokyo (JP)

(72) Inventors: Hiroki Kitagawa, Shizuoka (JP); Yuya Yamada, Shizuoka (JP); Ryuta Fujii, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 15/702,416

(22) Filed: Sep. 12, 2017

(65) Prior Publication Data

US 2018/0083433 A1 Mar. 22, 2018

(30) Foreign Application Priority Data

Sep. 16, 2016 (JP) ................................. 2016-181741

(51) Int. Cl.

| H01R 4/18 | (2006.01) |
|---|---|
| H02G 15/02 | (2006.01) |
| H01B 7/00 | (2006.01) |
| H01R 13/58 | (2006.01) |
| H05K 9/00 | (2006.01) |
| H02G 3/08 | (2006.01) |
| H02G 15/068 | (2006.01) |

(52) U.S. Cl.
CPC ........... *H02G 15/02* (2013.01); *H01B 7/0045* (2013.01); *H01R 13/58* (2013.01); *H02G 3/083* (2013.01); *H02G 15/068* (2013.01); *H05K 9/0081* (2013.01); *H05K 9/0098* (2013.01)

(58) Field of Classification Search
CPC .... H02G 15/02; H01B 7/0045; H05K 9/0081; H01R 13/58; H01R 12/596
USPC .............. 439/98, 607.44, 607.68, 607.5, 866
See application file for complete search history.

(56) References Cited

U.S. PATENT DOCUMENTS

| 4,272,148 A * | 6/1981 | Knack, Jr. ............. H01R 9/032 439/455 |
|---|---|---|
| 6,280,208 B1 * | 8/2001 | Masuda ................... H01R 4/64 174/359 |
| 6,669,511 B1 * | 12/2003 | Yagi ....................... H01R 4/646 439/607.44 |
| 6,793,532 B2 * | 9/2004 | Saito ..................... H01R 9/032 174/360 |
| 9,093,782 B2 * | 7/2015 | Wang ................... H01R 13/641 |
| 9,472,901 B2 * | 10/2016 | Wang ................... H01R 13/648 |
| 9,793,692 B1 * | 10/2017 | Pogash ................ H02G 3/0406 |

FOREIGN PATENT DOCUMENTS

JP 2006-269666 A 10/2006

* cited by examiner

*Primary Examiner* — Hae Moon Hyeon
(74) *Attorney, Agent, or Firm* — Kenealy Vaidya LLP

(57) ABSTRACT

A terminal fitting includes a cylindrical portion having a first crimping region and a second crimping region. A crimped state of a braided body extending through the terminal fitting is formed between the terminal fitting and a cable at the first crimping region such that relative movements of the terminal fitting and the braided body are prevented, and an end of the braided body is then folded back and positioned to face an outer surface of the cylindrical portion in a radial direction. The crimped state of the braided body is then formed between a sleeve and the terminal fitting at the second crimping region, so that the terminal fitting is fixed to the braided body.

7 Claims, 4 Drawing Sheets

TERMINAL FITTING FIXING STRUCTURE AND WIRE HARNESS

CROSS-REFERENCE TO RELATED APPLICATION(S)

The present application claims priority to and incorporates by reference the entire contents of Japanese Patent Application No. 2016-181741 filed in Japan on Sep. 16, 2016.

BACKGROUND OF THE INVENTION

1. Field of the Invention

The present invention relates to a terminal fitting fixing structure and a wire harness.

2. Description of the Related Art

Conventionally, there is a case where unshielded cables are used for some cables provided between a power source and various electronic devices mounted on a vehicle and electrically connecting the power source with the electronic devices, for example. Such an unshielded cable is constituted by a conductive core wire and an insulator covering the core wire. Since electromagnetic noise may be generated by a high-voltage current output from a power source and flowing through an unshielded cable, a braided body covers a part of an outer surface of the unshielded cable. The braided body has at both ends thereof terminal fittings electrically connected with a vehicle body of the vehicle. The electrical connection of the braided body with the vehicle body via the terminal fittings prevents or reduces influence of electromagnetic noise generated in the unshielded cable on electronic devices such as a radio, for example.

As an example of a terminal fitting fixing structure that fixes a terminal fitting to a braided body, Japanese Patent Application Laid open No. 2006-269666 proposes a terminal fitting fixing structure in which a terminal fitting is fitted around an unshielded cable and a braided body such that the unshielded cable and the braided body pass through the terminal fitting, an end of the braided body is folded back in an axial direction, a sleeve is further fitted around the terminal fitting, and the sleeve is crimped onto the terminal fitting with the folded back braided body sandwiched between the sleeve and the terminal fitting, so that the terminal fitting is fixed to the braided body.

In the terminal fitting fixing structure, however, the movements of the terminal fitting and the braided body relative to each other are not restricted until the sleeve is crimped onto the terminal fitting. Thus, even when the terminal fitting fitted around the cable and the braided body is positioned at a predetermined position relative to the braided body, the terminal fitting may be shifted in position relative to the braided body during mounting of the terminal fitting fixing structure, lowering workability.

SUMMARY OF THE INVENTION

The present invention has been made in view of the above, and an object thereof is to provide a terminal fitting fixing structure and a wire harness capable of fixing a terminal fitting to a braided body in a state in which movements of the terminal fitting and the braided body relative to each other are prevented.

In order to achieve the above mentioned object, a terminal fitting fixing structure according to one aspect of the present invention includes a braided body covering part of a cable including a core wire and an insulator, the braided body being formed by braided metal wires, a terminal fitting having a cylindrical portion through which the braided body passes and being electrically connected with a ground member, and a sleeve through which the cylindrical portion passes in a state in which a first end of the braided body being folded back at a first end side of the terminal fitting in an axial direction is sandwiched between the sleeve and the cylindrical portion, wherein the cylindrical portion has a first crimping region and a second crimping region in the axial direction, in the first crimping region, the cylindrical portion is deformed radially inward and forms a crimped state of the braided body between the terminal fitting and the cable, and in the second crimping region, the sleeve is deformed radially inward, and forms a crimped state of the braided body at least between the sleeve and the terminal fitting.

According to another aspect of the present invention, in the terminal fitting fixing structure, the terminal fitting may have a flange protruding radially outward at a second end in the axial direction, and the first end of the braided body may be at least partially in contact with the flange.

According to still another aspect of the present invention, in the terminal fitting fixing structure, the first crimping region may be formed on the first end side of the terminal fitting, and the second crimping region may be formed on a position closer to a second end side of the terminal fitting than the first crimping region.

A wire harness according to still another aspect of the present invention includes a cable including a core wire and an insulator, a braided body covering part of the cable and being formed by braided metal wires, a terminal fitting having a cylindrical portion through which the braided body passes, and being electrically connected with a ground member, and a sleeve through which the cylindrical portion passes in a state in which a first end of the braided body being folded back at a first end side of the terminal fitting in the axial direction is sandwiched between the sleeve and the cylindrical portion, wherein the cylindrical portion has a first crimping region and a second crimping region in the axial direction, in the first crimping region, the cylindrical portion is deformed radially inward and forms a crimped state of the braided body between the terminal fitting and the cable, and in the second crimping region, the sleeve is deformed radially inward, and forms a crimped state of the braided body at least between the sleeve and the terminal fitting.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

An embodiment of a terminal fitting fixing structure and a wire harness according to the present invention will now be described hereinafter in detail with reference to the accompanying drawings. Note that the present invention is not limited to the embodiment. In addition, components in the embodiment below may include those that are easily conceivable to those skilled in the art, or those that are substantially the same. Furthermore, various omissions, substitutions, modifications, and changes can be made to the components in the embodiment below without departing from the gist of the invention.

Embodiment

Figure 1:
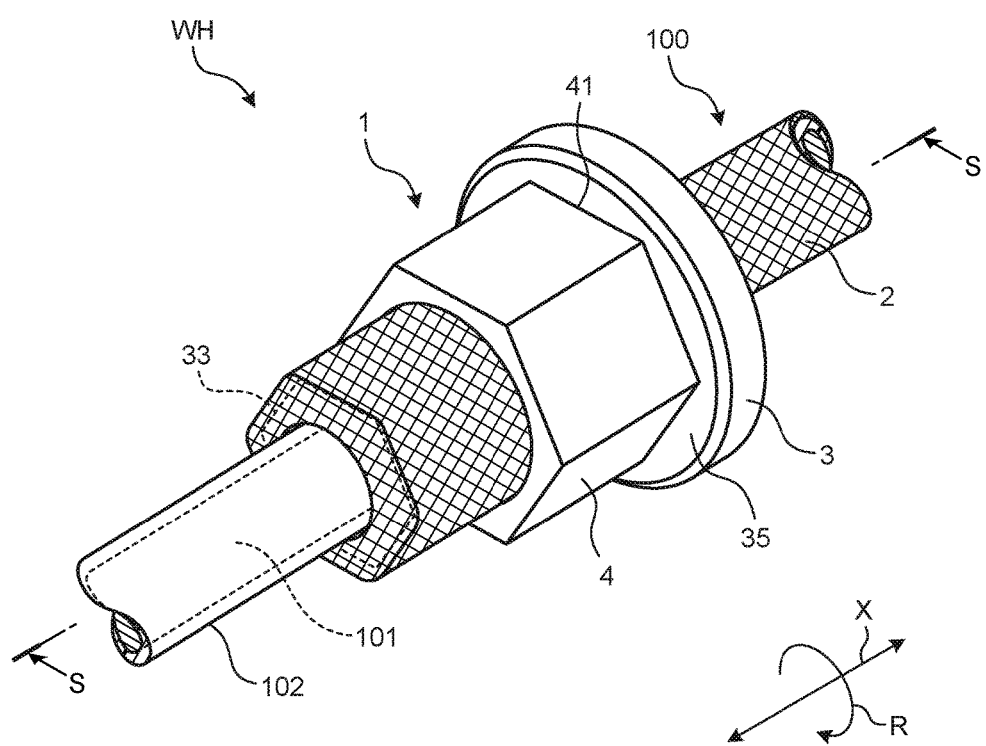
FIG. 1 is a perspective view of a terminal fitting fixing structure according to an embodiment.
Figure 2:
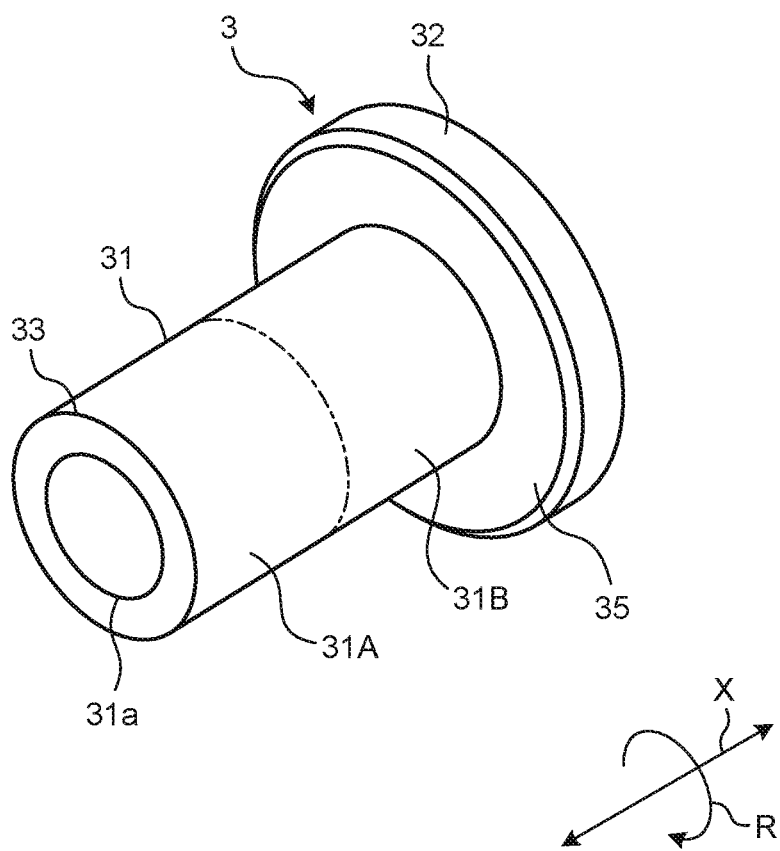
FIG. 2 is a perspective view of a terminal fitting according to the embodiment.
Figure 3:
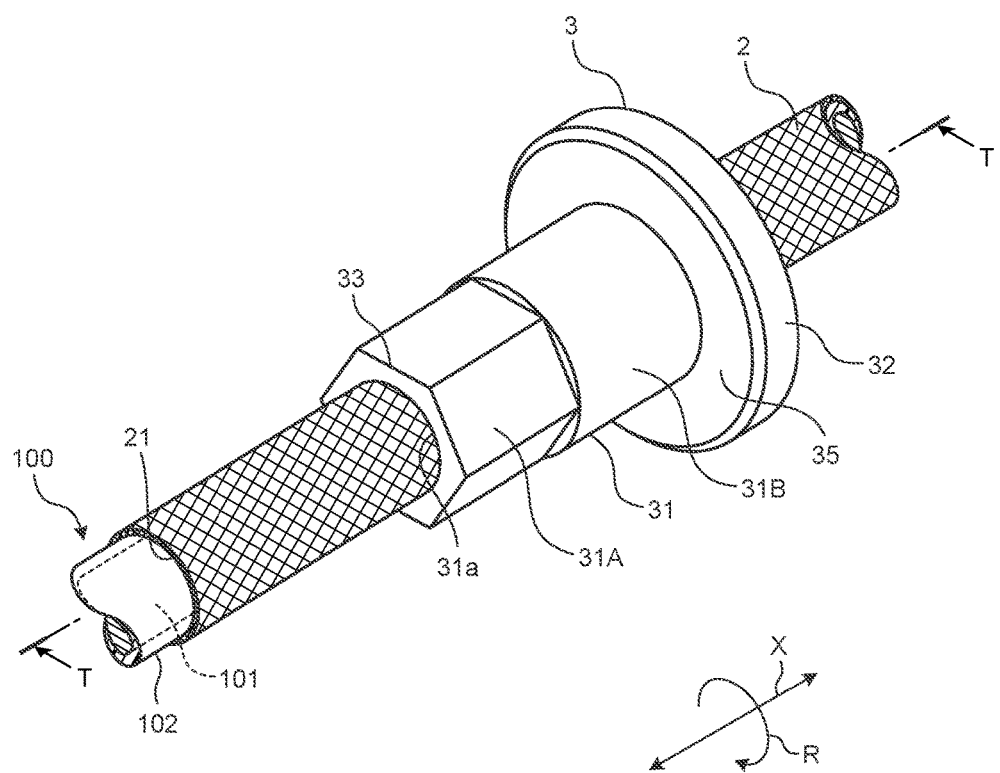
FIG. 3 is an explanatory view of mounting of the terminal fitting fixing structure according to the embodiment.
Figure 4:
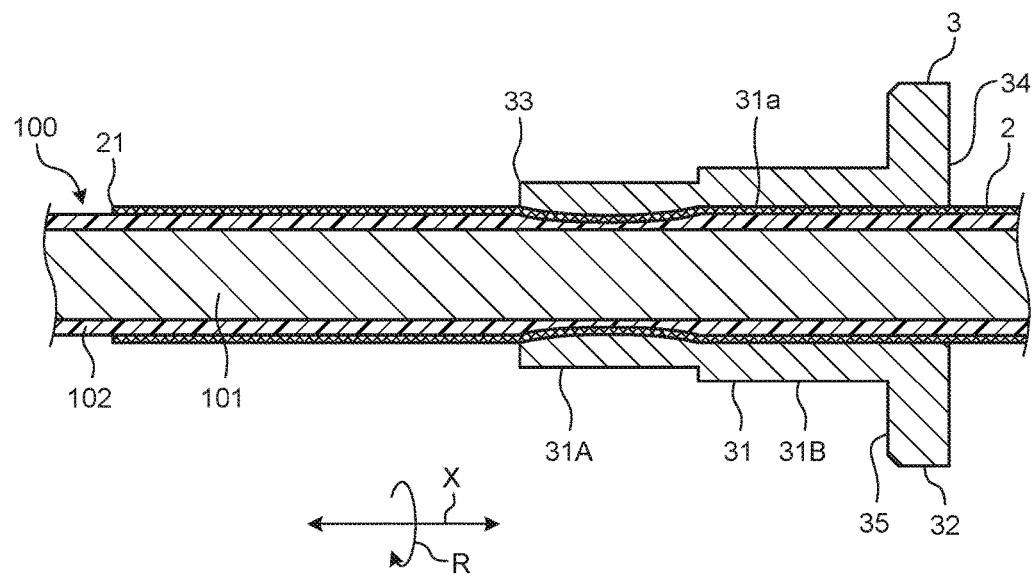
FIG. 4 is an explanatory view of mounting of the terminal fitting fixing structure according to the embodiment.
Figure 5:
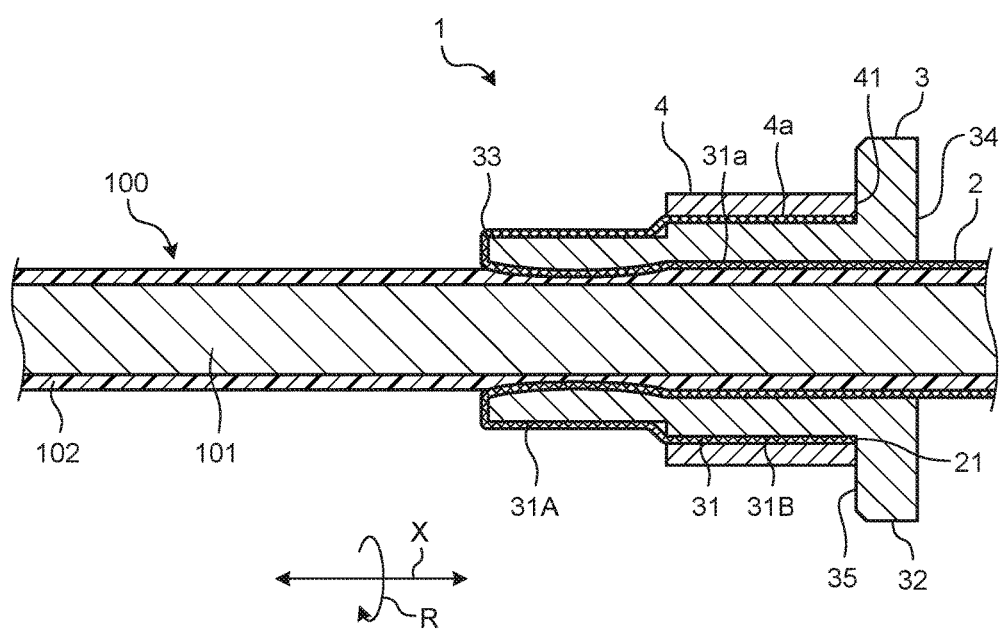
FIG. 5 is a cross-sectional view of the terminal fitting fixing structure according to the embodiment.

First, a terminal fitting fixing structure and a wire harness according to an embodiment will be described. FIG. 1 is a perspective view of the terminal fitting fixing structure according to the embodiment. FIG. 2 is a perspective view of a terminal fitting according to the embodiment. FIG. 3 is an explanatory view of mounting of the terminal fitting fixing structure according to the embodiment. FIG. 4 is an explanatory view of mounting of the terminal fitting fixing structure according to the embodiment. FIG. 5 is a cross-sectional view of the terminal fitting fixing structure according to the embodiment. FIGS. 3 and 4 illustrate a state before a sleeve is fitted around a cylindrical portion in the terminal fitting fixing structure. FIG. 4 is a cross-sectional view along T-T in FIG. 3. FIG. 5 is a cross-sectional view along S-S in FIG. 1. In each of the drawings, the X direction corresponds to an axial direction of a terminal fitting. The R direction is a direction perpendicular to the X direction, which corresponds to the circumferential direction of the terminal fitting.

As illustrated in FIG. 1, a terminal fitting fixing structure 1 is a fixing structure that fixes a terminal fitting 3 to a braided body 2 covering a part of a cable 100. The terminal fitting fixing structure 1 includes the braided body 2, the terminal fitting 3, and a sleeve 4.

The cable 100 is a part of components of a wire harness WH. Note that the wire harness WH electrically connects components of a vehicle with one another, and is constituted by cables including the cable 100 to which the terminal fitting fixing structure 1 is applied, connectors, an electrical connection box, and the like. The cable 100 is flexible, and is provided between a power source (not shown) mounted on the vehicle and various electronic devices operated by power from the power source so as to electrically connect these components with each other. As illustrated in FIG. 1, the cable 100 is an unshielded cable constituted by a core wire 101 and an insulator 102. Note that an unshielded cable refers to a cable that includes no shield member such as the braided body 2 as a component, unlike a shielded cable having an entire outer surface along the axial direction covered with a shield member such as the braided body 2. The core wire 101 is a wire made of conductive metal, and transmits current supplied from the power source to various electronic devices. The insulator 102 is an insulating synthetic resin such as vinyl chloride, or the like, and covers the core wire 101 through an insert molding or the like to prevent from exposing the core wire 101 to the outside.

The braided body 2 is a so-called electromagnetic shield member for that prevents or reduces influence of electromagnetic noise generated by a high-voltage current flowing through the cable 100 on electronic devices such as a radio, for example. As illustrated in FIG. 1, the braided body 2 covers a part in the axial direction of the cable 100. Thus, in a region of the cable 100 covered by the braided body 2, the electromagnetic noise is blocked from radiating to the outside of the cable 100 by the braided body 2. The braided body 2 is formed by braiding a plurality of metal wires, that is, braided wires. In other words, wires made of metal are formed into a net-like shape, and thus the braided body 2 has flexibility. Thus, when the cable 100 are bent, the braided body 2 is capable of bending following the cable 100. As illustrated in FIGS. 1 to 5, the terminal fitting 3 is fixed to a first end 21 of the braided body 2 in the axial direction. A terminal fitting 3 is also fixed to a second end (not shown) of the braided body 2 in the axial direction. As illustrated in FIGS. 1 and 5, the first end 21 of the braided body 2 is folded back at a first end side in the axial direction and positioned to face the outer surface of a cylindrical portion 31, which will be described later, of the terminal fitting 3 in the radial direction. As illustrated in FIG. 5, the folded first end 21 of the braided body 2 is at least partially in contact with a flange 32, which will be described later.

The terminal fitting 3 is electrically connected to a ground member, and transmits electromagnetic noise blocked by the braided body 2 to the vehicle body side. The terminal fitting 3 in the embodiment is contained in and electrically connected with a shield shell, which is not illustrated and which is the ground member. Since the shield shell is electrically connected with the vehicle body (body), the terminal fitting 3 is indirectly electrically connected with the vehicle body. The terminal fitting 3 is made of a conductive metal. The terminal fitting 3 is fixed to a predetermined position relative to the vehicle body such that the braided body 2 covers a region of the cable 100 where electromagnetic noise is to be blocked from the vehicle body. As illustrated in FIG. 2, the terminal fitting 3 includes the cylindrical portion 31 and the flange 32.

As illustrated in FIGS. 2 to 5, the cylindrical portion 31 is formed in a cylindrical shape having a through-hole 31a along the axial direction. The cylindrical portion 31 has openings formed at a first end portion 33 and a second end portion 34 in the axial direction, and the through-hole 31a connects the openings. The through-hole 31a is formed to have a hole diameter that is slightly larger than the diameter of the braided body 2 covering the cable 100 before a primary crimped state. The cable 100 and the braided body 2 covering the cable 100 are inserted in the through-hole 31a, pass through the cylindrical portion 31, and are exposed to the outside of the terminal fitting 3 through the openings formed at the first and second end portions 33 and 34. The cylindrical portion 31 has a first crimping region 31A and a second crimping region 31B.

As illustrated in FIG. 2, the first crimping region 31A and the second crimping region 31B are defined by dividing the cylindrical portion 31 in the axial direction (see a dashed-dotted line in FIG. 2). The first crimping region 31A is a region formed on the first end portion 33 of the cylindrical portion 31 of the terminal fitting 3. In the first crimping region 31A as illustrated in FIGS. 1, 3 to 5, the cylindrical portion 31 is deformed radially inward into a hexagonal shape as viewed in the axial direction with the cylindrical portion 31 passing through the braided body 2 covering the cable 100, and thus forms the primary crimped state in which the braided body 2 is crimped between the terminal fitting 3 and the cable 100. The first crimping region 31A in the primary crimped state is deformed such that the corners of the hexagonal shape are inscribed in or positioned radially inward of an outer circumcircle of the cylindrical portion 31 (in this case, the second crimping region 31B) as viewed in the axial direction.

The second crimping region 31B is a region formed at a position closer to the second end 34 side of the cylindrical portion 31 of the terminal fitting 3 than the first crimping region 31A is. As illustrated in FIGS. 1 and 5, in the primary crimped state, a sleeve 4 is positioned radially outside of the second crimping region 31B and deformed radially inward into a hexagonal shape as viewed in the axial direction, and a secondary crimped state in which the braided body 2 sandwiched between the sleeve 4 and the terminal fitting 3 is crimped is formed.

The flange 32 comes electrically in contact with the shield shell. The flange 32 protrudes radially outward at the second end 34 of the cylindrical portion 31 and is formed around the whole circumference. The flange 32 is formed to have an outer diameter larger than that of the sleeve 4. The flange 32 comes in contact with at least part of the first end 21 of the braided body 2 folded back to a first end face 35 of respective end faces in the axial direction of the flange 32 in a fixed state in which the terminal fitting 3 is fixed to the braided body 2.

The cylindrical portion 31 passes through the sleeve 4 in a state in which the first end 21 of the braided body 2 is sandwiched. The sleeve 4 is formed into a cylindrical shape having a through-hole 4a along the axial direction. The through-hole 4a is formed to have a hole diameter that is slightly larger than the outer diameter of the cylindrical portion 31 in a state covered with the folded braided body 2 before the secondary crimped state. After the primary crimped state, the sleeve 4 is put on the cylindrical portion 31 of the terminal fitting 3 and slid to the second crimping region 31B with the first end 21 of the braided body 2 folded back, sandwiches the braided body 2 with the cylindrical portion 31, and is crimped in a state extending through the cylindrical portion 31. The sleeve 4 provides greater fixing strength to fix the terminal fitting 3 to the braided body 2. In addition, the sleeve 4 forms the secondary crimped state of the braided body 2 between the sleeve 4 and the terminal fitting 3, so as to securely electrically connect the braided body 2 with the terminal fitting 3. In the secondary crimped state, a second end face 41 of respective end faces in the axial direction of the sleeve 4 is in contact with the first end face 35 of the flange 32.

An example of the work for mounting the terminal fitting fixing structure 1 will be described. Here, the terminal fitting 3 to be mounted on the first end 21 of the braided body 2 will be described. First, an operator puts the through-hole 31a of the terminal fitting 3 on the cable 100 from the flange 32 side. The operator further slides the terminal fitting 3 such that the braided body 2 covering the cable 100 is inserted in the through-hole 31a. The operator further slides the terminal fitting 3 such that the cable 100 and the braided body 2 pass through the terminal fitting 3 and are exposed from the end 33 of the cylindrical portion 31. Subsequently, the operator positions the terminal fitting 3 relative to the braided body 2 such that the first end 21 can be at least in contact with the first end face 35 of the flange 32 when being folded back at the first end side in the axial direction of the terminal fitting 3, that is, at the end 33 side. Subsequently, in the first crimping region 31A, the operator swages the cylindrical portion 31 by using a jig, which is not illustrated, to carry out so-called primary crimping as illustrated in FIGS. 3 and 4. As a result of being swaged, the cylindrical portion 31 is deformed radially inward into a hexagonal shape as viewed in the axial direction, and the primary crimped state of the cylindrical portion 31 on the braided body 2 and the cable 100 is formed. This prevents relative movements of the braided body 2 and the terminal fitting 3, and the primary crimping work on the cylindrical portion 31 in the first crimping region 31A is completed.

Subsequently, the operator folds the first end 21 of the braided body 2 back in the axial direction from the end 33 of the cylindrical portion 31, and positions the folded first end 21 to face the outer surface of the cylindrical portion 31 from radially outside of the cylindrical portion 31. Subsequently, the operator brings at least part of the first end 21 into contact with the first end face 35 of the flange 32. At this point, the braided body 2 is in a state covering the entire outer surfaces of the first crimping region 31A and the second crimping region 31B, that is, the cylindrical portion 31.

Subsequently, the operator puts the through-hole 4a of the sleeve 4 on the cable 100 toward the terminal fitting 3 in the primary crimped state. The operator further slides the sleeve 4 such that cylindrical portion 31 with the outer surface covered with the braided body 2 is inserted in the through-hole 4a. The operator further slides the sleeve 4, so that the second end face 41 of the sleeve 4 comes into contact with the first end face 35 of the flange 32. This restricts further sliding of the sleeve 4, and fitting of the sleeve 4 to the terminal fitting 3 is completed. At this point, the sleeve 4 is located at the second crimping region 31B of the cylindrical portion 31. Subsequently, in the second crimping region 31B, the operator swages the sleeve 4 by using the jig, which is not illustrated, to carry out so-called secondary crimping as illustrated in FIGS. 1 and 5. As a result of being swaged, the sleeve 4 is deformed radially inward into a hexagonal shape, and the secondary crimped state of at least the sleeve 4, the braided body 2, and the cylindrical portion 31 is formed. This prevents relative movements of the braided body 2, and the sleeve 4 and the terminal fitting 3, that is, relative movements of the sleeve 4 and the terminal fitting 3 with the braided body 2 therebetween, and the secondary crimping work on the sleeve 4 at the second crimping region 31B is completed. In this manner, the work for mounting the terminal fitting fixing structure 1 is completed.

As described above, in the terminal fitting fixing structure 1 according to the embodiment, the cylindrical portion 31 has the first crimping region 31A and the second crimping region 31B. The primary crimped state of the braided body 2 between the terminal fitting 3 and the cable 100 is formed by primary crimping at the first crimping region 31A, which allows the first end 21 of the braided body 2 to be folded back and positioned radially outside of the outer surface of the cylindrical portion 31 in the state in which relative movements of the terminal fitting 3 and the braided body 2 are prevented, which facilitates the folding back work. Furthermore, since the sleeve 4 is put on the cylindrical portion 31 in the state in which the folded first end 21 is sandwiched therebetween and the movement of the terminal fitting 3 relative to the cable 100 and the braided body 2 is prevented when the secondary crimping is carried at the second crimping region 31B, the terminal fitting 3 is prevented from being shifted in position relative to the braided body 2 until the secondary crimping is carried out, which allows the secondary crimping of the terminal fitting 3 to be carried out at a predetermined position relative to the braided body 2. Consequently, since the terminal fitting fixing structure 1 is capable of fixing the terminal fitting 3 to the braided body 2 in the state in which movements of the terminal fitting 3 and the braided body 2 relative to each other are prevented, the workability of the mounting of the terminal fitting fixing structure 1 is improved.

If the first crimping region 31A and the second crimping region 31B are at the same position in the terminal fitting fixing structure 1, the primary crimping on the first crimping region 31A and the secondary crimping on the second crimping region 31B are carried out at the same position. In a case where the primary crimping and the secondary crimping are carried out at the same position, the secondary crimping needs to be carry out in such a manner that the circumferential positions of the jig correspond to the hexagonal shape formed by the primary crimping so that the six corners of the hexagonal shape of the sleeve 4 formed by the secondary crimping as viewed in the axial direction match those of the hexagonal shape of the cylindrical portion 31 formed by the primary crimping. For example, if the sleeve 4 is swaged with the positions of the corners of the hexagonal shape formed by the secondary crimping being shifted from those of the corners of the hexagonal shape formed by the primary crimping, a gap or distortion may be caused between the shape of the cylindrical portion 31 resulting from the primary crimping and the shape of the sleeve 4 resulting from the secondary crimping, which may disadvantageously lower the fixing strength of crimping after the swaging work. On the other hand, adjustment of the circumferential positions of the jig to match the hexagonal shape resulting from the secondary crimping with the hexagonal shape resulting from the primary crimping lowers the workability. Thus, in the embodiment, since the primary crimping and the secondary crimping are respectively carried out at the first crimping region 31A and the second crimping region 31B, which are at different positions, the positions of the hexagonal shapes formed by the primary crimping and the secondary crimping need not be considered, which improves the workability.

Furthermore, in the terminal fitting fixing structure 1 according to the embodiment, when the braided body 2 is folded back in the axial direction from the end 33 of the cylindrical portion 31 through the first crimping such that the length in the axial direction of the first end 21 of the braided body 2 exposed from the cylindrical portion 31 is the length of the outer surface of the cylindrical portion 31 to the flange 32 in the axial direction, at least part of the end 21 of the braided body 2 is brought into contact with the end face 35 of the flange 32. Thus, the operator need not carry out the folding work while positioning the first end 21 to the position on the cylindrical portion 31 where the sleeve 4 is to be crimped, which improves the workability.

Furthermore, in the terminal fitting fixing structure 1 according to the embodiment, since the second crimping region 31B is formed on the flange 32 side, the sleeve 4 may be formed in contact with the first end face 35 of the flange 32, for positioning with respect to the second crimping region 31B. This allows the second crimping of the sleeve 4 in a state in which the movement of the sleeve 4 in the axial direction is restricted by the flange 32, which improves the workability in mounting of the terminal fitting fixing structure 1.

The wire harness WH of the embodiment includes the terminal fitting fixing structure 1, and allows the terminal fitting 3 to be fixed to the braided body 2, which improves the workability in mounting of the terminal fitting fixing structure 1.

While the terminal fitting 3 in the embodiment includes the cylindrical portion 31 formed in a cylindrical shape and the flange 32, the terminal fitting 3 is not limited thereto. A so-called flag terminal having a flag-like terminal connector, or the like, may be used for the terminal fitting to be fixed to the braided body 2. In this case, the terminal fitting 3 is directly electrically connected with the vehicle body, which is a ground member, by being fastened with a fastener such as a bolt. The terminal fitting 3 that is a flag terminal has the first crimping region 31A and the second crimping region 31B on the cylindrical portion, which is not illustrated, through which the cable 100 and the braided body 2 extend.

The first crimping region 31A and the second crimping region 31B in the embodiment may be at positions opposite to those in the embodiment in the axial direction. Specifically, in this case, the first crimping region 31A is formed on the flange 32 side and the second crimping region 31B is formed on the end 33 side.

A terminal fitting fixing structure and a wire harness according to the present embodiment are capable of forming a crimped state of the braided body between the terminal fitting and the cable at the first crimping region, then folding back one end of the braided body such that the folded end faces the outer surface of the cylindrical portion, and crimping the braided body between the sleeve fitted around the cylindrical portion and the terminal fitting. Thus, the terminal fitting can be fixed to the braided body in a state in which relative movements of the terminal fitting and the braided body are prevented.

Although the invention has been described with respect to specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:
1. A terminal fitting fixing structure comprising:
a braided body covering part of a cable including a core wire and an insulator, the braided body being formed by braided metal wires;
a terminal fitting having a cylindrical portion through which the braided body passes, and configured to be electrically connected with a ground member; and
a sleeve through which the cylindrical portion passes in a state in which a first end of the braided body being folded back at a first end of the terminal fitting in an axial direction is sandwiched between the sleeve and the cylindrical portion, wherein
the cylindrical portion has a first crimping region and a second crimping region in the axial direction,
in the first crimping region, the cylindrical portion is deformed radially inward and forms a crimped state of the braided body between the terminal fitting and the cable,
in the second crimping region, the sleeve is deformed radially inward, and forms a crimped state of the braided body at least between the sleeve and the terminal fitting,
the first crimping region and the second crimping region are disposed apart from each other in the axial direction so as to not overlap each other, and
the first crimping region is disposed closer to the first end of the terminal fitting than the second crimping region in the axial direction.
2. The terminal fitting fixing structure according to claim 1, wherein
the terminal fitting has a flange protruding radially outward at a second end in the axial direction, and the first end of the braided body is at least partially in contact with the flange.

3. The terminal fitting fixing structure according to claim 1, wherein
the second crimping region is formed on a position closer to a second end of the terminal fitting than the first crimping region.

4. The terminal fitting fixing structure according to claim 2, wherein
the second crimping region is formed on a position closer to the second end of the terminal fitting than the first crimping region.

5. The terminal fitting fixing structure according to claim 1, wherein
the terminal fitting includes an inner surface, and
the braided body includes an outer surface that abuts the inner surface of the terminal fitting in the first crimping region.

6. The terminal fitting fixing structure according to claim 1, wherein
the cylindrical portion extends in the axial direction from the first end of the terminal fitting to a second end of the terminal fitting,
the first crimping region extends axially from the first end of the terminal fitting to an intermediate location between the first end of the terminal fitting and a second end of the terminal fitting, and
the second crimping region extends axially from the second end of the terminal fitting to the intermediate location.

7. A wire harness comprising:
a cable including a core wire and an insulator;
a braided body covering part of the cable and being formed by braided metal wires;
a terminal fitting having a cylindrical portion through which the braided body passes, and configured to be electrically connected with a ground member; and
a sleeve through which the cylindrical portion passes in a state in which a first end of the braided body being folded back at a first end of the terminal fitting in the axial direction is sandwiched between the sleeve and the cylindrical portion, wherein
the cylindrical portion has a first crimping region and a second crimping region in the axial direction,
in the first crimping region, the cylindrical portion is deformed radially inward and forms a crimped state of the braided body between the terminal fitting and the cable,
in the second crimping region, the sleeve is deformed radially inward, and forms a crimped state of the braided body at least between the sleeve and the terminal fitting,
the first crimping region and the second crimping region are disposed apart from each other in the axial direction so as to not overlap each other, and
the first crimping region is disposed closer to the first end of the terminal fitting than the second crimping region in the axial direction.

\* \* \* \* \*